US012638339B2

(12) United States Patent
Kwon et al.

(10) Patent No.: US 12,638,339 B2
(45) Date of Patent: May 26, 2026

(54) ELECTRONIC DEVICE AND METHOD OF ESTIMATING BODY TEMPERATURE USING THE SAME

(71) Applicant: SAMSUNG ELECTRONICS CO., LTD., Suwon-si (KR)

(72) Inventors: Bok Soon Kwon, Suwon-si (KR); Sang Kyu Kim, Suwon-si (KR); Sung Ho Kim, Suwon-si (KR); So Young Lee, Suwon-si (KR); Ho Taik Lee, Suwon-si (KR); Hong Soon Rhee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 695 days.

(21) Appl. No.: 18/085,775

(22) Filed: Dec. 21, 2022

(65) Prior Publication Data

US 2024/0011844 A1      Jan. 11, 2024

(30) Foreign Application Priority Data

Jul. 8, 2022    (KR) ........................ 10-2022-0084567
Nov. 29, 2022    (KR) ........................ 10-2022-0163087

(51) Int. Cl.
G01K 13/20        (2021.01)
G01K 1/143        (2021.01)
G01K 7/22        (2006.01)
H05K 1/181        (2026.01)
H05K 1/189        (2026.01)

(52) U.S. Cl.
CPC .............. *G01K 1/143* (2013.01); *G01K 7/22* (2013.01); *G01K 13/20* (2021.01); *H05K 1/181* (2013.01); *H05K 1/189* (2013.01); *H05K 2201/10151* (2013.01)

(58) Field of Classification Search
None
See application file for complete search history.

(56) References Cited

U.S. PATENT DOCUMENTS

| | | |
|---|---|---|
| 8,783,946 B2 | 7/2014 | Goto |
| 9,101,271 B2 | 8/2015 | Sattler |
| 9,951,552 B2 | 4/2018 | Veerasamy |
| 11,109,764 B2 | 9/2021 | Bongers et al. |
| 11,253,157 B2 | 2/2022 | Tanaka et al. |
| 2006/0044442 A1* | 3/2006 | Suh ........................ H04N 23/57 |
| | | 348/E5.025 |

(Continued)

FOREIGN PATENT DOCUMENTS

KR        10-1606747 B1        3/2016

*Primary Examiner* — Erica S Lin
(74) *Attorney, Agent, or Firm* — Sughrue Mion, PLLC

(57)        ABSTRACT

An electronic device may include: a sensor including a flexible printed circuit board, a plurality of temperature sensors arranged on the flexible printed circuit board, and a thermally conductive material disposed between the plurality of temperature sensors; and at least one processor configured to estimate a body temperature of a user based on data that is obtained by the plurality of temperature sensors when a contact surface of the sensor is contacted with the user, wherein the flexible printed circuit board is bent to have the plurality of temperature sensors arranged at different distances from the contact surface of the sensor.

12 Claims, 14 Drawing Sheets

(56) References Cited

U.S. PATENT DOCUMENTS

| | | | |
|---|---|---|---|
| 2006/0122673 A1* | 6/2006 | Callister | G05D 23/1925 |
| | | | 607/113 |
| 2010/0121217 A1 | 5/2010 | Padiy et al. | |
| 2011/0158284 A1* | 6/2011 | Goto | G01K 7/427 |
| | | | 374/E13.002 |
| 2011/0249701 A1* | 10/2011 | Bieberich | G01K 13/20 |
| | | | 374/163 |
| 2012/0024833 A1* | 2/2012 | Klewer | A61B 5/01 |
| | | | 219/209 |
| 2020/0359906 A1 | 11/2020 | Tanaka | |
| 2021/0038084 A1 | 2/2021 | Dion et al. | |
| 2022/0042856 A1 | 2/2022 | Igawa et al. | |

* cited by examiner

TEMPERATURE
DIFFERENCE

SETTING TEMPERATURE OF HOT PLATE

1200

ELECTRONIC DEVICE AND METHOD OF ESTIMATING BODY TEMPERATURE USING THE SAME

CROSS-REFERENCE TO RELATED APPLICATION(S)

This application claims priority from Korean Patent Application No. 10-2022-0084567, filed on Jul. 8, 2022 and Korean Patent Application No. 10-2022-0163087, filed on Nov. 29, 2022 in the Korean Intellectual Property Office, the disclosures of which are incorporated herein by reference in their entireties.

BACKGROUND

1. Field

Apparatuses and methods consistent with example embodiments relate to estimating body temperature using a plurality of sensors.

2. Description of the Related Art

Generally, body temperature is one of four vital signs and has very important clinical significance. A body temperature sensor may be applied to various applications for checking infections in patients, thermal side effects of medications, or time of ovulation in women, and the like. Body temperature measured by a temperature sensor is the internal temperature of the human body, such that it is desirable to measure the body temperature by using an invasive method, but the invasive method may cause inconvenience and danger. Accordingly, monitoring of the body temperature by using a non-invasive method is required not only in hospitals but also for healthcare in daily life. Generally, body temperature may be measured non-invasively by using an electronic device based on heat flux between temperature sensors. In order to increase the accuracy of estimating body temperature, it may be required to increase a heat flux intensity by a sufficient temperature difference and to block heat from the outside. There has been a demand for a body temperature measuring device having a structure that satisfies the above-mentioned requirements.

SUMMARY

According to an aspect of the present disclosure, an electronic device may include: a sensor including: a flexible printed circuit board; a plurality of temperature sensors arranged on the flexible printed circuit board; and a thermally conductive material disposed between the plurality of temperature sensors; and at least one processor configured to estimate a body temperature of a user based on data that is obtained by the plurality of temperature sensors when a contact surface of the sensor is contacted with the user, wherein the flexible printed circuit board is bent to have the plurality of temperature sensors arranged at different distances from the contact surface of the sensor.

The flexible printed circuit board is bent into have at least one of a G-shape and an S-shape.

The sensor may further include: a first plate and a second plate which are disposed on two opposing sides of the sensor, wherein the first plate and the second plate may include an aluminum material.

The plurality of temperature sensors may be arranged in series and aligned with each other.

At least one of the plurality of temperature sensors may be a thermistor.

The plurality of temperature sensors may include: a first temperature sensor configured to measure a first temperature of skin of the user at a body measurement location; a second temperature sensor spaced apart from the first temperature sensor in a thickness direction of the electronic device, and configured to measure a second temperature; and a third temperature sensor disposed further away from the first temperature sensor than the second temperature sensor in the thickness direction, and configured to measure a third temperature.

A distance between any two of the first temperature sensor, the second temperature sensor, and the third temperature sensor may be in a range from 0.4 mm to 10 mm.

The thermally conductive material may be air, and the distance between any two of the first temperature sensor, the second temperature sensor, and the third temperature sensor is 3 mm or less.

The at least one processor may be further configured to: estimate a core temperature of the user and an ambient temperature outside the electronic device based on the first temperature, the second temperature, and the third temperature; and estimate the body temperature of the user based on the core temperature at the body measurement location and the ambient temperature outside the electronic device.

The at least one processor may be further configured to: estimate a first heat flux based on the first temperature and the second temperature; and estimate the core temperature based on the first heat flux and the first temperature.

The at least one processor may be further configured to estimate a second heat flux based on the second temperature and the third temperature, and estimate the ambient temperature outside the electronic device based on the second heat flux and the third temperature.

The electronic device may further include a heat blocker configured to block heat from a side surface of the sensor.

The electronic device may further include a display configured to output at least one of the obtained data, the body temperature, and body temperature guidance information.

According to another aspect of the disclosure, a method of estimating body temperature in an electronic device, may include: by a first temperature sensor disposed on a flexible printed circuit board, measuring a first temperature of skin surface of a user at a body measurement location when a contact surface of the electronic device is in contact with the user; by a second temperature sensor spaced apart from the first temperature sensor in a thickness direction of the electronic device, measuring a second temperature; by a third temperature sensor disposed further away from the first temperature sensor than the second temperature sensor in the thickness direction, measuring a third temperature; estimating a core temperature at the body measurement location and an ambient temperature outside the electronic device based on the first temperature, the second temperature, and the third temperature; and estimating a body temperature of the user based on the core temperature at the body measurement location and the ambient temperature outside the electronic device, wherein the flexible printed circuit board is bent to have the first temperature sensor, the second temperature sensor, and the third temperature sensor arranged at different distances from the contact surface of the electronic device.

The estimating of the body temperature of the user may include: estimating a first heat flux based on the first temperature and the second temperature; and estimating the core temperature at the body measurement location based on the first heat flux and the first temperature.

The estimating of the body temperature of the user may include: estimating a second heat flux based on the second temperature and the third temperature; and estimating the ambient temperature outside the electronic device based on the second heat flux and the third temperature.

The method may further include: outputting at least one of the first temperature, the second temperature, the third temperature, the core temperature at the body measurement location, the ambient temperature outside the electronic device, the body temperature, and body temperature guidance information.

An electronic device may include: a flexible printed circuit board that is bent to have at least two portions having different height levels in a thickness direction of the electronic device; a plurality of temperature sensors arranged on the flexible printed circuit board at the at least two portions having the different height levels; and a thermally conductive material disposed between the plurality of temperature sensors.

The flexible printed circuit board may be bent to have at least one of a G-shape or an S-shape.

The electronic device may further include: a contact pad configured to come into contact with a skin surface of a user at a body measurement location; and at least one processor configured to estimate a body temperature of the user based on temperatures measured by the plurality of temperature sensors.

BRIEF DESCRIPTION OF THE DRAWINGS

The above and/or other aspects will be more apparent by describing certain example embodiments, with reference to the accompanying drawings, in which.

DETAILED DESCRIPTION

Figure 1:
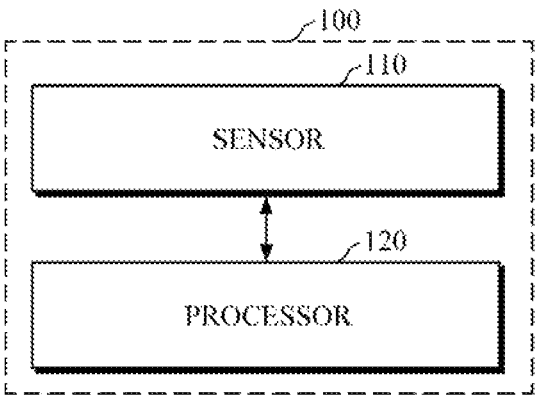
FIG. 1 is a block diagram illustrating an electronic device according to an embodiment of the present disclosure.

Example embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the example embodiments. However, it is apparent that the example embodiments can be practiced without those specifically defined matters. Also, well-known functions or constructions are not described in detail since they would obscure the description with unnecessary detail.

It will be understood that, although the terms first, second, etc. may be used herein to describe various elements, these elements should not be limited by these terms. These terms are only used to distinguish one element from another. Any references to singular may include plural unless expressly stated otherwise. In addition, unless explicitly described to the contrary, an expression such as "comprising" or "including" will be understood to imply the inclusion of stated elements but not the exclusion of any other elements. Also, the terms, such as 'unit' or 'module', etc., should be understood as a unit that performs at least one function or operation and that may be embodied as hardware, software, or a combination thereof.

Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, all of a, b, and c, or any variations of the aforementioned examples.

FIG. 1 is a block diagram illustrating an electronic device according to an embodiment of the present disclosure. FIGS. 2A, 2B, 3A, and 3B are diagrams illustrating an example of a structure of a sensor.

Referring to FIG. 1, an electronic device 100 includes a sensor 110 and a processor 120.

The sensor 110 may obtain data for estimating body temperature from a user. The processor 120 may be electrically connected to the sensor 110 to control the sensor 110 in response to a request for estimating body temperature, and may estimate body temperature by using data obtained by the sensor 110.

Referring to FIGS. 2A, 2B, 3A, and 3B, the sensor 110 includes a flexible sensor board 220, a plurality of temperature sensors 230, 240, and 250, and a thermally conductive material 260. In addition, the sensor 110 may further include a first plate 210 and a second plate 270 disposed on two opposing sides of a housing that includes the plurality of sensors. However, the number of the plurality of sensors is not limited to the illustrated example.

The first plate 210 has a predetermined thermal conductivity and may be disposed on a surface at a body measurement location. The body measurement location is a contact portion between the body and the electronic device during measurement of body temperature. Examples of the body measurement location may include a chest adjacent to a core body part, and a peripheral body part (e.g., wrist, ankle, auricle, palm of the hand, upper arm, and the like). However, the body measurement location is not limited thereto.

The first plate 210 may have a thermal conductivity equal to or higher than a predetermined level (e.g., 237 W/mk) in order to increase heat flux from a central part of the body measurement location (e.g., central part of the wrist, core part, etc.) to the inside of the electronic device, and may be made of a material having a high thermal conductivity (e.g., aluminum material).

The second plate 270 may be disposed opposite to the first plate 210 at a position that allows for contact with air, and may also be made of a material having a high thermal conductivity, e.g., aluminum material. However, the materials of the first plate 210 and the second plate 270 are not limited thereto. Depending on the arrangement of the first plate 210 and the second plate 270, heat flux from the central part of the body measurement location to the inside of the electronic device may increase, as well as heat flux from the inside to the top of the electronic device.

The flexible sensor board 220 is a board having flexible properties such that the board may be bent into a predetermined shape, and may be, for example, a flexible printed circuit board (FPCB). However, the type of the flexible sensor board 220 is not limited thereto.

The plurality of temperature sensors may include: a first temperature sensor 230 configured to measure a first temperature of the surface at the body measurement location; a second temperature sensor 240 spaced apart from the first temperature sensor and configured to measure a second temperature; and a third temperature sensor 250 disposed further away from the first temperature sensor than the second temperature sensor and configured to measure a third temperature. In this case, at least one of the plurality of temperature sensors may be a thermistor. The thermistor is a contact-type temperature sensor among temperature sensors for measuring temperature, and may come into contact with, for example, the wrist of an object to measure a surface temperature of the wrist.

The first temperature sensor 230, the second temperature sensor 240, and the third temperature sensor 250 may be disposed on the flexible sensor board 220. In this case, the flexible sensor board 220 is bent into a predetermined shape, such that the first temperature sensor 230, the second temperature sensor 240, and the third temperature sensor 250 may be arranged at different distances from the surface at the body measurement location.

Figure 2A:
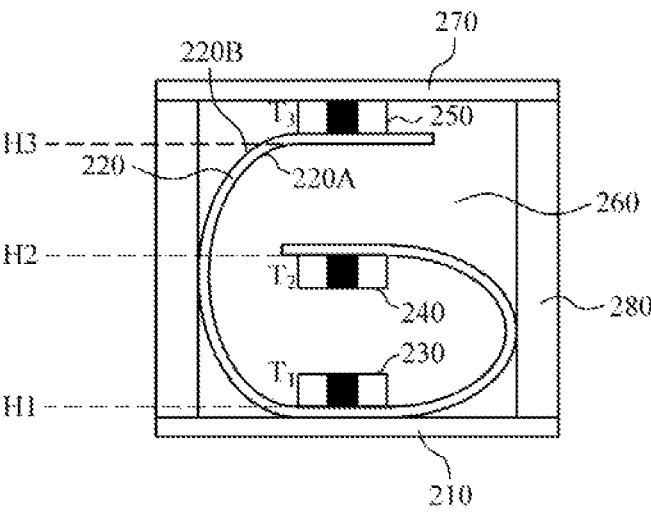
FIGS. 2A, 2B, 3A, and 3B are diagrams illustrating an example of a structure of a sensor.
Figure 2B:
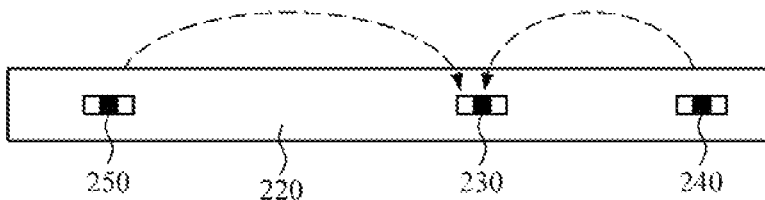

Referring to FIGS. 2A and 2B, the flexible sensor board 220 may be bent into a G-shape, and the first temperature sensor 230, the second temperature sensor 240, and the third temperature sensor 250 may be arranged at different distances from the surface at the body measurement location. For example, in order to arrange the plurality of temperature sensors on the G-shaped flexible sensor board 220 at positions gradually away from the surface at the body measurement location as illustrated in FIG. 2A, the flexible sensor board 220 is formed in the G-shape in such a manner that the third temperature sensor 250, the first temperature sensor 230, and the second temperature sensor 240 are arranged in a line on the flexible sensor board 220, and with respect to the first temperature sensor 230 disposed at the center, the flexible sensor board 220 at the position of the second temperature sensor 240 disposed adjacent to the center is bent inward, and the flexible sensor board 220 at the position of the third temperature sensor 250 disposed further away from the center is bent over above the second temperature sensor 240, as illustrated in FIG. 2B.

Referring to FIG. 2A, the flexible sensor board 220 may have a first surface 220A on which the first temperature sensor 230 and the second temperature sensor 240 are disposed, and a second surface 220B on which the third temperature sensor 250 is disposed. However, the arrangement of the temperature sensors 230, 240, and 250 is not limited thereto. According to embodiments of the disclosure, the third temperature sensor 250 may be disposed on the first surface 220A, and/or the second temperature sensor 240 may be disposed on the second surface 220B. The flexible sensor board 220 may be bent so that the first surface 220A at the position of the first temperature sensor 230 is located at a first height level H1 (with a predetermined margin), the first surface 220A at the position of the second temperature sensor 240 is located at a second height level H2 (with the predetermined margin), and the first surface 220A at the position of the third temperature sensor 250 is located at a third height level H3 (with the predetermined margin).

Figure 3A:
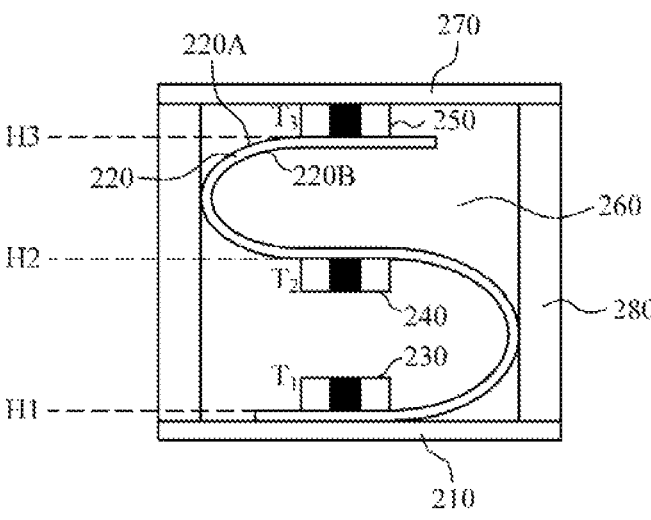
Figure 3B:
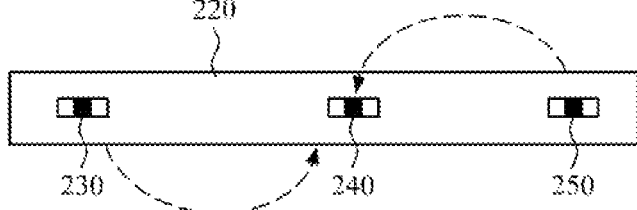

In addition, referring to FIGS. 3A and 3B, the flexible sensor board 220 may be bent into an S-shape, and the first temperature sensor 230, the second temperature sensor 240, and the third temperature sensor 250 may be arranged on the S-shaped flexible sensor board 220 at positions gradually away from the surface at the body measurement location. For example, in order to arrange the plurality of temperature sensors on the S-shaped flexible sensor board 220 at positions gradually away from the surface at the body measurement location as illustrated in FIG. 3A, the flexible sensor board 220 is formed in the S-shape in such a manner that the first temperature sensor 230, and the second temperature sensor 240, and the third temperature sensor 250 are arranged in a line on the flexible sensor board 220, and with respect to the second temperature sensor 240 disposed at the center between the temperature sensors 230 and 240 disposed at equal intervals on both sides, the flexible sensor board 220 at the position of the first temperature sensor 230 is bent downward and the flexible sensor board 220 at the position of the third temperature sensor 250 is bent upward, as illustrated in FIG. 3B. However, the shape of the flexible sensor board 220 is not limited thereto.

Referring to FIG. 3A, the flexible sensor board 220 may have two opposing surfaces, a first surface 220A and a second surface 220B, and the first temperature sensor 230, the second temperature sensor 240, and the third temperature sensor 250 may be disposed on the first surface 220A. However, the arrangement of the temperatures sensors 230, 240, and 250 is not limited thereto. According to embodiments of the disclosure, at least one of the first temperature sensor 230, the second temperature sensor 240, and the third temperature sensor 250 may be disposed on the second surface 220B. The flexible sensor board 220 may be bent so that the first surface 220A at the position of the first temperature sensor 230 is located at a first height level H1 (with a predetermined margin), the first surface 220A at the position of the second temperature sensor 240 is located at a second height level H2 (with the predetermined margin), and the first surface 220A at the position of the third temperature sensor 250 is located at a third height level H3 (with a predetermined margin).

Distances between the respective temperature sensors arranged on the flexible sensor board 220 may be in a range from 0.4 mm to 10 mm. For example, each of the distance between the first temperature sensor 230 and the second temperature sensors 240 and the distance between the second temperature sensors 240 and the third temperature sensor 250 may be in a range from 0.4 mm to 10 mm. In addition, the first temperature sensor 230 may come into contact with or may be disposed adjacent to the first plate 210, and the third temperature sensor 250 may come into contact with or may be disposed adjacent to the second plate 270.

Further, the plurality of temperature sensors may be arranged in series and aligned with each other on the flexible sensor board 220. For example, in the case where the first temperature sensor 230, the second temperature sensor 240, and the third temperature sensor 250 are arranged in series and aligned with each other, heat flux generated by a temperature difference between the central part of the body measurement location and a position around an upper portion of the electronic device may be maximized, thereby increasing the accuracy in measuring body temperature.

The thermally conductive material 260 may be disposed between the plurality of temperature sensors. The thermally conductive material 260 may be an insulator having a size of 0.1 mm to 5 mm, and may be a material (e.g., polyurethane foam or air) having a thermal conductivity of 0.1 W/mK or less. Further, air having a very low thermal conductivity may be used as the thermally conductive material 260, without using a separate material. When the thermally conductive material is air, the distance between any two of the first temperature sensor, the second temperature sensor, and the third temperature sensor is 3 mm or less.

The first temperature sensor 230, the second temperature sensor 240, and the third temperature sensor 250 are spaced apart from each other with distance D in the thickness direction of a main body case of the electronic device 100 The distance D may correspond to a difference between the height level H1 and the height level H2, and/or a difference between the height level H2 and the height level H3. When the electronic device 100 is implemented as a smart watch, there may be restrictions on the height of each of the temperature sensors 230, 240, and 250, and the distance D between the temperature sensors 230, 240, and 250 since the area of the smart watch that can accommodate the temperature sensors 230, 240, and 250 is small.

For example, the height of the area of the smart watch that can accommodate the temperature sensors 230, 240, and 250 may be in a range from 1 mm to 1.5 mm. Given the limited height of the area in the smartwatch, the distance D between the temperature sensors 230, 240, and 250 may decrease as the height of the temperature sensors 230, 240, and 250 increases, while a certain distance between any two of the temperature sensors 230, 240, and 250 is required to obtain a minimum temperature difference (e.g., 0.3° C.) between the two of the temperature sensors 230, 240, and 250 and thereby to estimate a body temperature based on the temperature difference. Since the temperature sensors 230, 240, and 250 may have some error rate (e.g., ±0.1° C.), it may be difficult to reliably measure the temperature difference between the two of the temperature sensors 230, 240, and 250 when a target temperature difference between the two of the temperature sensors 230, 240, and 250 is set to be less than 0.3° C. Based on such understanding, a minimum target temperature difference between the two of the temperature sensors 230, 240, and 250 may be set to 0.3° C., and a heat transfer simulation has been conducted by changing the height of the temperature sensors 230, 240, and 250 and the distance D, as shown below in Table 1.

TABLE 1

| Area height H | Height of Temperature Sensor (mm) | Distance D between Temperature Sensors (mm) | Temperature Difference (° C.) |
|---|---|---|---|
| 1 mm | 0.1 | 0.8 | 0.648 |
|  | 0.2 | 0.6 | 0.486 |
|  | 0.3 | 0.4 | 0.324 |
|  | 0.4 | 0.2 | 0.162 |
| 1.1 mm | 0.1 | 0.9 | 0.730 |
|  | 0.2 | 0.7 | 0.567 |
|  | 0.3 | 0.5 | 0.405 |
|  | 0.4 | 0.3 | 0.243 |
| 1.2 mm | 0.1 | 1 | 0.811 |
|  | 0.2 | 0.8 | 0.648 |
|  | 0.3 | 0.6 | 0.486 |
|  | 0.4 | 0.4 | 0.324 |
|  | 0.5 | 0.2 | 0.162 |
| 1.3 mm | 0.1 | 1.1 | 0.892 |
|  | 0.2 | 0.9 | 0.730 |
|  | 0.3 | 0.7 | 0.567 |
|  | 0.4 | 0.5 | 0.405 |
|  | 0.5 | 0.3 | 0.243 |
| 1.4 mm | 0.1 | 1.2 | 0.973 |
|  | 0.2 | 1 | 0.811 |
|  | 0.3 | 0.8 | 0.648 |

8

TABLE 1-continued

| Area height H | Height of Temperature Sensor (mm) | Distance D between Temperature Sensors (mm) | Temperature Difference (° C.) |
|---|---|---|---|
|  | 0.4 | 0.6 | 0.486 |
|  | 0.5 | 0.4 | 0.324 |
|  | 0.6 | 0.2 | 0.162 |
| 1.5 mm | 0.1 | 1.3 | 1.054 |
|  | 0.2 | 1.1 | 0.892 |
|  | 0.3 | 0.9 | 0.730 |
|  | 0.4 | 0.7 | 0.567 |
|  | 0.5 | 0.5 | 0.405 |
|  | 0.6 | 0.3 | 0.243 |

Referring to Table 1 above, when a target temperature difference between the two of the temperature sensors 230, 240, and 250 is greater than or equal to 0.3° C., the height of each of the temperature sensors 230, 240, and 250 may be set to have a minimum height of 0.3 mm (i.e., 0.3 mm or greater, and preferably from 0.3 mm to 0.5 mm), and the distance D between two of the temperature sensors 230, 240, and 250 may be set to a minimum height of 0.4 mm or (i.e., 0.4 mm or greater, and preferably from 0.4 mm to 1.3 mm).

The first temperature sensor 230 may be disposed as close as possible to the contact surface, and the third temperature sensor 250 may be disposed as close as possible to the display panel to provide a relatively accurate temperature estimation.

Figure 4:
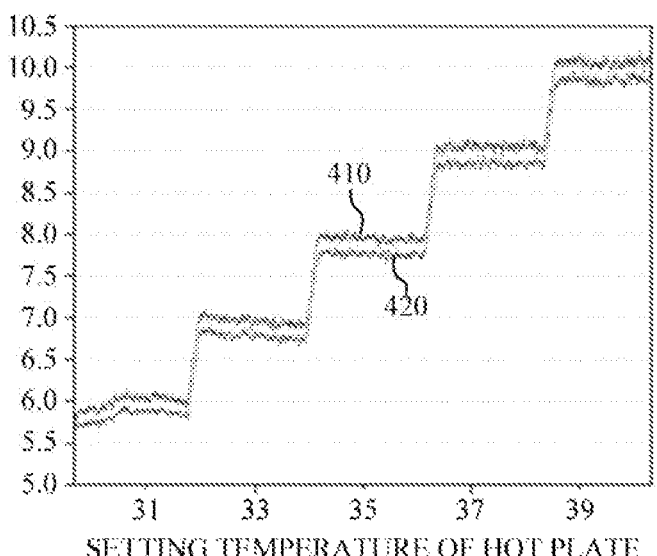
FIG. 4 is a graph showing comparison between ethylene vinyl acetate (EVA) foam and air which are used as a thermally conductive material.

FIG. 4 is a graph showing comparison between ethylene vinyl acetate (EVA) foam and air which are used as a thermally conductive material. In this case, the x-axis indicates setting temperature of a hot plate, and the y-axis indicates a temperature difference between temperature sensors.

Generally, the EVA and air have similar thermal conductivity, with the EVA foam having a thermal conductivity of about 0.035 W/mK, and air having a thermal conductivity of about 0.025 W/mK. However, referring to FIG. 4, it can be seen that a temperature difference 410 measured by only filling air is greater than a temperature difference 420 measured by using two temperature sensors disposed at both ends with the EVA foam disposed at the center in the sensor, such that heat flux increases more when using air than using the EVA foam. In addition, as in this embodiment, by using the flexible sensor board 220 when air is used as the thermally conductive material, the arrangement of the temperature sensors in the sensor may be easily adjusted, thereby effectively increasing the heat flux.

In addition, the electronic device 100 may further include a heat blocking part for blocking heat from a side surface of the sensor.

Referring back to FIGS. 2A and 3A, the electronic device 100 may further include a heat blocking part (e.g., a heat blocker) 280 disposed to cover the sensor 110, and reducing the effect of heat (e.g., external temperature) introduced from the side surface of the sensor and heat loss from the inside to the outside of the sensor 110.

Figure 5:
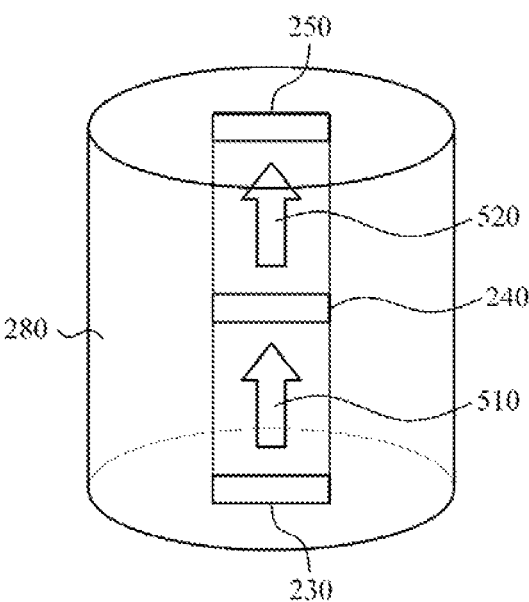
FIG. 5 is a diagram illustrating an example of a heat blocking part disposed around a sensor according to an embodiment of the present disclosure.

FIG. 5 is a diagram illustrating an example of the heat blocking part 280 disposed around the sensor 110 according to an embodiment of the present disclosure. For example, an insulator in a foam form is disposed to cover the periphery of the sensor 110, and increases heat fluxes 510 and 520 generated from the temperature sensors 230, 240, and 250 arranged in series and reduces heat loss in a horizontal direction. The type and arrangement of the heat blocking part 280 is not limited thereto.

The processor 120 may estimate body temperature based on the data obtained by the plurality of temperature sensors. For example, the processor 120 may estimate a core temperature at the body measurement location and an ambient temperature outside the electronic device based on the obtained first, second, and third temperatures, and may estimate a user's body temperature based on the estimated core temperature at the body measurement location and the estimated ambient temperature outside the electronic device.

Referring back to FIGS. 2A and 3A, the processor 120 may estimate a first heat flux $Q_1$ based on the first temperature $T_1$ and the second temperature $T_2$, and may estimate the core temperature at the body measurement location based on the estimated first heat flux $Q_1$ and the first temperature $T_1$.

For example, the processor 130 may estimate the first heat flux $Q_1$ based on a temperature difference between the first temperature $T_1$ and the second temperature $T_2$. Generally, assuming that a flow of heat is a current, a heat transfer property of a material is resistance, and a heat flux is a voltage, the flow of heat may be described by a mathematical expression according to Bohr's law (V=IR), and a temperature difference $T_1$–$T_2$ in a material may be estimated as the heat flux $Q_1$. In this case, the core temperature at the body measurement location may be estimated by combining the estimated first heat flux $Q_1$ and the first temperature $T_1$ which is the surface temperature at the body measurement location, and may be represented by the following Equation 1.

$$T_{core} = T_1 + \frac{T_1 - T_2}{\varepsilon} \qquad \text{[Equation 1]}$$

Herein, $T_{core}$ denotes the core temperature at the body measurement location, and $\varepsilon$ denotes a predetermined coefficient.

Then, the processor 120 may estimate a second heat flux $Q_2$ based on the second temperature $T_2$ and the third temperature $T_3$, and may estimate the ambient temperature outside the electronic device based on the estimated second heat flux $Q_2$ and the third temperature $T_3$.

For example, the processor 120 may estimate the second heat flux $Q_2$ based on a temperature difference $T_2$–$T_3$ between the second temperature $T_2$ and the third temperature $T_3$, and may estimate the ambient temperature outside the electronic device by combining the estimated second heat flux $Q_2$ and the third temperature $T_3$.

First, the processor 120 may estimate the second heat flux $Q_2$ based on a temperature difference $T_2$–$T_3$ between the second temperature $T_2$ and the third temperature $T_3$. For example, assuming that heat transfer from the surface at the body measurement location to the top of the electronic device occurs in a series circuit and a generated heat flux is $Q_T$, a temperature difference between the first temperature $T_1$ and the second temperature $T_2$, a temperature difference between the second temperature $T_2$ and the third temperature $T_3$, and a temperature difference between the third temperature $T_3$ and ambient temperature $T_{air}$ outside the electronic device may be estimated as the same heat flux $Q_T$. In this case, with respect to the flow of heat at the inner and upper portions of the electronic device, the following Equation 2 may be derived based on Bohr's law (V=IR).

$$\frac{k_1}{\Delta x_1}(T_1 - T_2) = \frac{k_2}{\Delta x_2}(T_2 - T_3) = h_{air}(T_3 - T_{air}) \qquad \text{[Equation 2]}$$

Herein, $\Delta x_1$ denotes a distance between the first temperature sensor 230 and the second temperature sensor 240; $\Delta x_2$ denotes a distance between the second temperature sensor 240 and the third temperature sensor 250; $k_1$ denotes a thermal conductivity between the first temperature sensor 230 and the second temperature sensor 240; $k_2$ denotes a thermal conductivity between the second temperature sensor 240 and the third temperature sensor 250; and hair denotes the convective heat transfer coefficient of air. Further, a ratio between $k_1$ and $\Delta x_1$ and a ratio between $k_2$ and $\Delta x_2$ in Equation 2 may respectively denote a resistance value of the thermally conductive material disposed between the first temperature sensor 230 and the second temperature sensor 240 and a resistance value of the thermally conductive material disposed between the second temperature sensor 240 and the third temperature sensor 250. In this case, if air is filled in the sensor 110, $k_1$ and $k_2$ may denote the thermal conductivity of air, and $k_1$, $k_2$, and hair may be predetermined values and may be stored in a storage of the electronic device.

By using Equation 2, the ambient temperature $T_{air}$ outside the electronic device may be expressed by the following Equation 3.

$$T_{air} = T_3 - \frac{k_2}{\Delta x_2 h_{air}}(T_2 - T_3) = T_3 - \beta(T_2 - T_3) \qquad \text{[Equation 3]}$$

Here, $\beta$ denotes a correction coefficient and a heat transfer rate based on physical properties.

That is, according to Equation 3, by combining the third temperature $T_3$ with a result obtained by applying the correction coefficient $\beta$ to the heat flux $Q_2$ estimated based on the temperature difference $T_2$–$T_3$ between the second temperature and the third temperature, the processor 120 may measure the ambient temperature $T_{air}$ outside the electronic device.

Then, the processor 120 may estimate a user's body temperature based on the estimated core temperature at the body measurement location and the ambient temperature outside the electronic device.

For example, the processor 120 may obtain a heat loss from a reference location in the body (or body reference location) to the body measurement location, and may estimate body temperature $T_{body}$ by correcting the core temperature $T_{core}$ at the body measurement location based on the obtained heat loss, which may be expressed by the following Equation 4. In this case, the body reference location may be, for example, a core part.

$$T_{body} = T_{core} + T_{loss} \qquad \text{[Equation 4]}$$

Herein, $T_{loss}$ denotes the heat loss occurring from the body reference location to the body measurement location, and may be, for example, a heat loss from a core part to the wrist. Generally, the heat loss changes with outside air temperature and occurs by conduction, convection, and radiation. The heat loss due to conduction and convection is proportional to a difference between skin temperature and outside air temperature, and the heat loss due to radiation is proportional to the fourth power of a temperature difference between the skin temperature and the outside air temperature. Based on the relationship, the heat loss may be estimated during estimation of the body temperature by using the electronic device, which may be expressed by the following Equation 5.

$$T_{loss} = \gamma(T_1 - T_{air}) + \delta(T_1^4 - T_{air}^4)$$  [Equation 5]

Herein, r and δ are predetermined heat loss coefficients.

Figure 6:
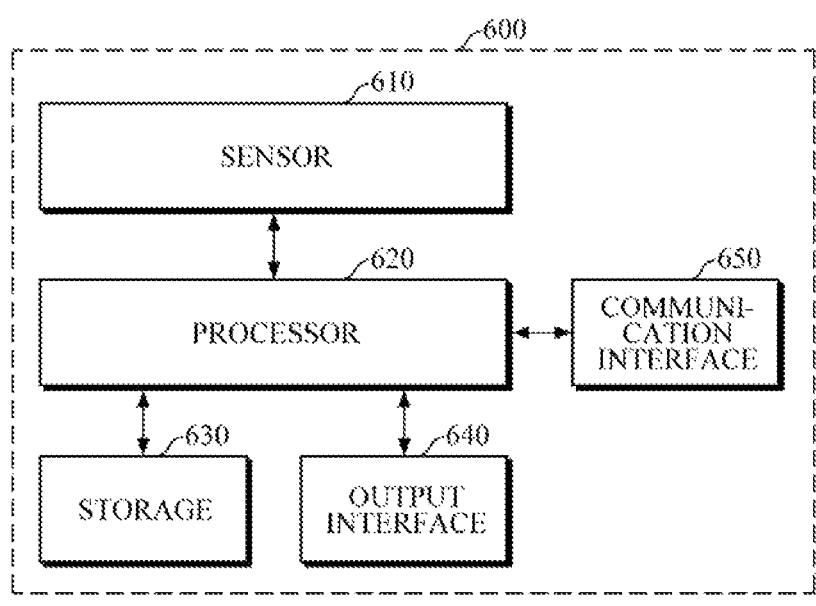
FIG. 6 is a block diagram illustrating an electronic device for estimating body temperature according to another embodiment of the present disclosure.

FIG. 6 is a block diagram illustrating an electronic device for estimating body temperature according to another embodiment of the present disclosure.

Referring to FIG. 6, an electronic device 600 includes a sensor 610, a processor 620, a storage 630, an output interface 640, and a communication interface 650. In this case, the sensor 610 and the processor 620 are the same as the sensor 110 and the processor 120 of FIG. 1, such that a detailed description thereof will be omitted.

The storage 630 may store information related to estimating body temperature. For example, the storage 630 may store temperature data obtained by the sensor 610, resistance values of thermally conductive materials, correction coefficients, heat loss coefficients, and processing results of the processor 120, for example, heat flux, estimated core temperature values at the body measurement location, estimated ambient temperature values outside the electronic device, and the like.

The storage 630 may include at least one storage medium of a flash memory type memory, a hard disk type memory, a multimedia card micro type memory, a card type memory (e.g., an SD memory, an XD memory, etc.), a Random Access Memory (RAM), a Static Random Access Memory (SRAM), a Read Only Memory (ROM), an Electrically Erasable Programmable Read Only Memory (EEPROM), a Programmable Read Only Memory (PROM), a magnetic memory, a magnetic disk, and an optical disk, and the like, but is not limited thereto.

The output interface 640 may provide processing results of the processor 620 for a user. For example, the output interface 640 may display a body temperature value estimated by the processor 620 on a display. In this case, the output interface 640 may provide the user with information by changing color, line thickness, etc., so that the user may easily recognize the estimated body temperature value. The output interface 640 may also provide information on a continuous body temperature change over time. Further, the output interface 640 may output at least one of the obtained data (e.g., temperature data), body temperature, and body temperature guidance information to the display. In addition, the output interface 640 may output body temperature, ambient temperature outside the main body, or body surface temperature to the display and may provide the user with the data. In this case, along with or without the visual display, the output interface 640 may provide the user with body temperature information in a non-visual manner by voice, vibrations, tactile sensation, and the like using an audio output module, such as a speaker and the like, or a haptic module.

The communication interface 650 may communicate with an external device to transmit and receive various data related to estimating body temperature. The external device may include an information processing device, such as a smartphone, a tablet PC, a desktop computer, a laptop computer, and the like. For example, the communication interface 650 may transmit a body temperature measurement result to the external device, such as a smartphone and the like, and a user may monitor the body temperature over time by using, e.g., the smartphone.

The communication interface 650 may communicate with the external device by using various wired and wireless communication techniques including Bluetooth communication, Bluetooth Low Energy (BLE) communication, Near Field Communication (NFC), WLAN communication, Zigbee communication, Infrared Data Association (IrDA) communication, Wi-Fi Direct (WFD) communication, Ultra-Wideband (UWB) communication, Ant+ communication, WIFI communication, Radio Frequency Identification (RFID) communication, 3G, 4G, 5G, and 6G communications, and the like. However, the communication techniques are not limited thereto.

Figure 7:
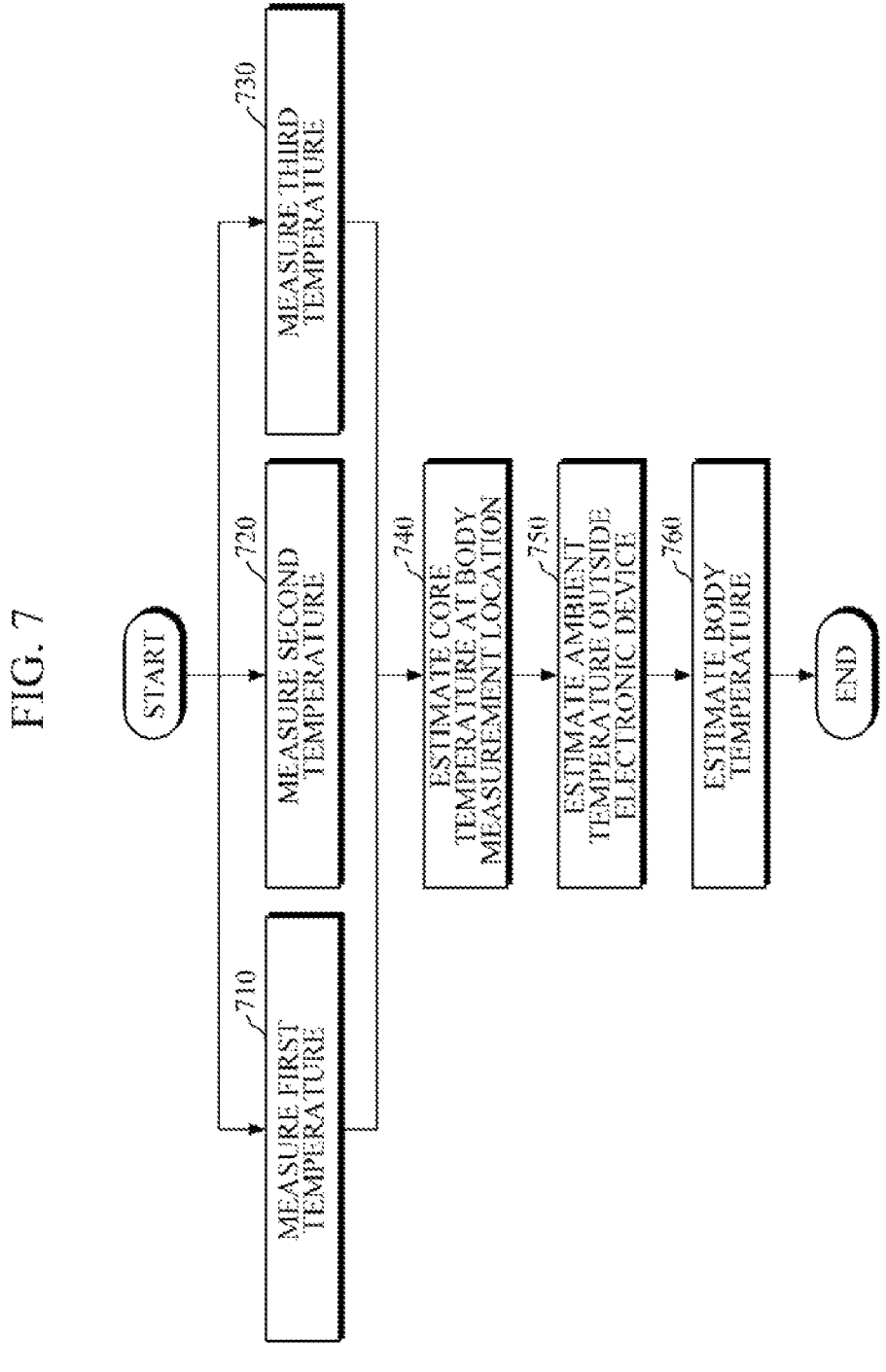
FIG. 7 is a flowchart illustrating a method of estimating body temperature according to an embodiment of the present disclosure.

FIG. 7 is a flowchart illustrating a method of estimating body temperature according to an embodiment of the present disclosure.

The method of FIG. 7 is an example of a method of estimating body temperature performed by the electronic devices 100 and 600 according to the embodiments of FIGS. 1 and 6, which are described in detail above, and thus will be briefly described below in order to avoid redundancy.

Referring to FIG. 7, the electronic device may measure a first temperature of a surface at a body measurement location by using the first temperature sensor disposed on the flexible sensor board in operation 710, may measure a second temperature by using the second temperature sensor spaced apart from the first temperature sensor in operation 720, and may measure a third temperature by using the third temperature sensor disposed further away from the first temperature sensor than the second temperature sensor in operation 730. In this case, the flexible sensor board is bent into a predetermined shape so that the first, second, and third temperature sensors may be arranged gradually away from the surface at the body measurement location.

Then, the electronic device may estimate a core temperature at the body measurement location based on the measured temperatures in operation 740. For example, the electronic device may estimate a first heat flux based on the first temperature and the second temperature, and may estimate the core temperature at the body measurement location based on the estimated first heat flux and the first temperature.

Subsequently, the electronic device may estimate an ambient temperature outside the electronic device based on the measured temperatures in operation 750. For example, the electronic device may estimate a second heat flux based on the second temperature and the third temperature, and may estimate the ambient temperature outside the electronic device based on the estimated second heat flux and the third temperature.

Next, the electronic device may estimate a user's body temperature based on the estimated core temperature at the body measurement location and the ambient temperature outside the electronic device in operation 760. For example, the electronic device may obtain a heat loss from the body reference location to the body measurement location, and may estimate the body temperature by correcting the core temperature at the body measurement location based on the obtained heat loss.

In addition, the electronic device may further perform an operation of outputting, through the output interface, at least one of the first temperature, second temperature, third temperature, core temperature at the body measurement location, ambient temperature outside the main body, body temperature, and body temperature guidance information. In this case, along with or without the visual display, the output interface may provide the user with body temperature information in a non-visual manner by voice, vibrations, tactile sensation, and the like using an audio output module, such as a speaker and the like, or a haptic module.

FIGS. 8 to 12 are diagrams illustrating examples of structures of an electronic device.

Figure 8:
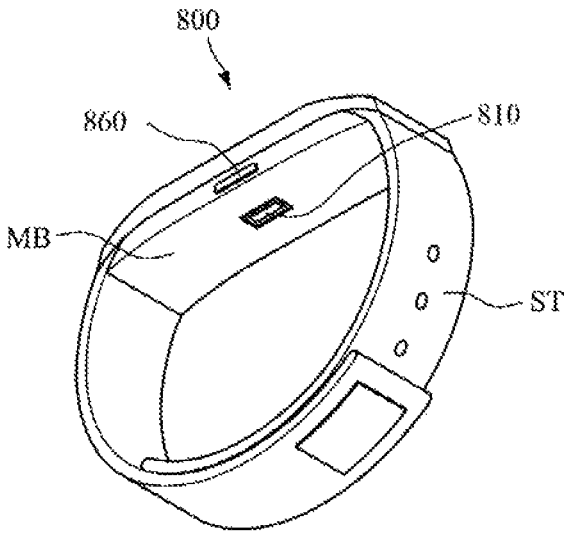
FIGS. 8 to 12 are diagrams illustrating examples of structures of an electronic device.

Referring to FIG. 8, the electronic device may be implemented as a smart watch-type wearable device 800 which includes a main body MB and a wrist strap ST.

The main body MB may be formed in various shapes. A battery may be embedded in the main body MB and/or the strap ST to supply power to various components of the wearable device. The strap ST may be connected to both ends of the main body to allow the main body to be worn on a user's wrist, and may be flexible so as to be wrapped around the user's wrist. The strap ST may be composed of a first strap and a second strap which are separated from each other. One end of each of the first strap and the second strap is connected to both sides of the main body MB, and the first strap and the second strap may be connected to each other via a fastening means formed at the other end of the respective straps. In this case, the fastening means may be formed as magnetic connection, Velcro connection, pin connection, etc., but is not limited thereto. Further, the strap ST is not limited thereto, and may be integrally formed as a non-detachable band.

The main body MB may include a sensor 810, a processor, an output interface, a storage, and a communication interface. However, depending on the size and shape of a form factor and the like, some of the output device, the storage, and the communication interface may be omitted.

The sensor 810 may include a first temperature sensor configured to measure a first temperature, a second temperature sensor configured to measure a second temperature, and a third temperature sensor configured to measure a third temperature, in which the first, second, and third temperature sensors may be disposed at different distances from a body contact surface. In this case, the first temperature may be a surface temperature at a body measurement location, and the second temperature and the third temperature may be different temperatures inside the main body which are measured by the second and third temperature sensors spaced apart from each other. In the sensor 810, a flexible sensor board is bent into a predetermined shape so that the first temperature sensor, the second temperature sensor, and the third temperature sensor may be arranged gradually away from the surface at the body measurement location.

In this case, the sensor 810 may be disposed on a rear surface of the main body MB, so that when the main body MB is worn on the user's wrist, the sensor 810 may come into contact with an upper part of the user's wrist to obtain data for measuring body temperature.

A manipulator 860 may be formed on a side surface of the main body MB, as illustrated herein. The manipulator 860 may receive a user's command and may transmit the received command to the processor. In addition, the manipulator 860 may have a power button to turn on/off the wearable device 800.

The processor mounted in the main body MB may be electrically connected to various components including the sensor 810. The processor may estimate a user's body temperature by using the data obtained by the plurality of sensors 810. For example, while the main body MB is worn, the processor may estimate the core temperature at the body measurement location and the ambient temperature outside the electronic device based on the obtained first, second, and third temperatures, and may estimate the user's body temperature based on the estimated core temperature at the body measurement location and the estimated ambient temperature outside the electronic device.

Figure 9:
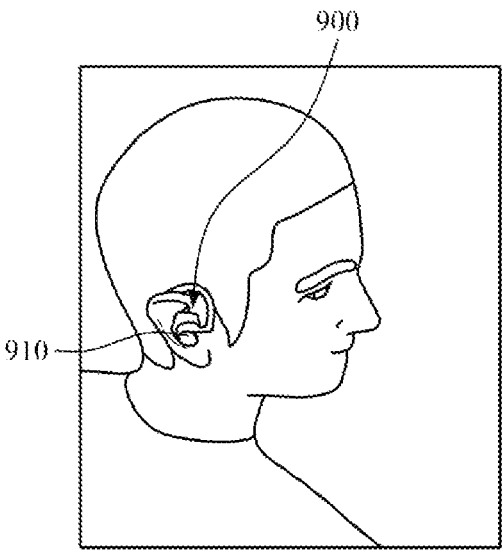

Referring to FIG. 9, the electronic device may be implemented as an ear-wearable device 900.

The ear-wearable device 900 may include a main body and an ear strap. A user may wear the ear-wearable device 900 by hanging the ear strap on the user's auricle. The ear strap may be omitted depending on a shape of the ear-wearable device 900. The main body may be inserted into the external auditory meatus. A sensor 910 may be mounted in the main body. The ear-wearable device 900 may provide the user with a body temperature estimation result as sound, or may transmit the estimation result to an external device, e.g., a mobile device, a tablet PC, a personal computer, etc., through a communication module provided in the main body.

Figure 10:
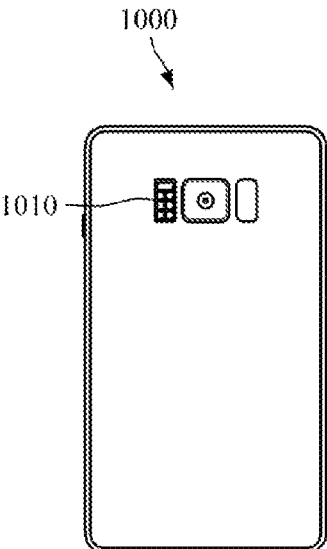

Referring to FIG. 10, the electronic device may be implemented as a mobile device 1000 such as a smartphone.

The mobile device 1000 may include a housing and a display panel. The housing may form an outer appearance of the mobile device 1000. The housing has a first surface, on which a display panel and a cover glass may be disposed sequentially, and the display panel may be exposed to the outside through the cover glass. A sensor 1010, a camera module and/or an infrared sensor, and the like may be disposed on a second surface of the housing.

For example, a plurality of sensors for obtaining data from a user may be disposed on a rear surface of the mobile device 1000, and a fingerprint sensor disposed on the front surface of the mobile device 1000, a power button or a volume button disposed on a side surface the mobile device 1000, a sensor disposed on another position of the front and rear surfaces of the mobile device 1000, and the like may be provided to estimate body temperature.

In addition, when a user transmits a request for estimating body temperature by executing an application and the like installed in the mobile device 1000, the mobile device 1000 may obtain data by using the sensor 1010, and may estimate the body temperature and may provide the estimated value as image and/or sound to the user by using the processor in the mobile device 1100.

Figure 11:
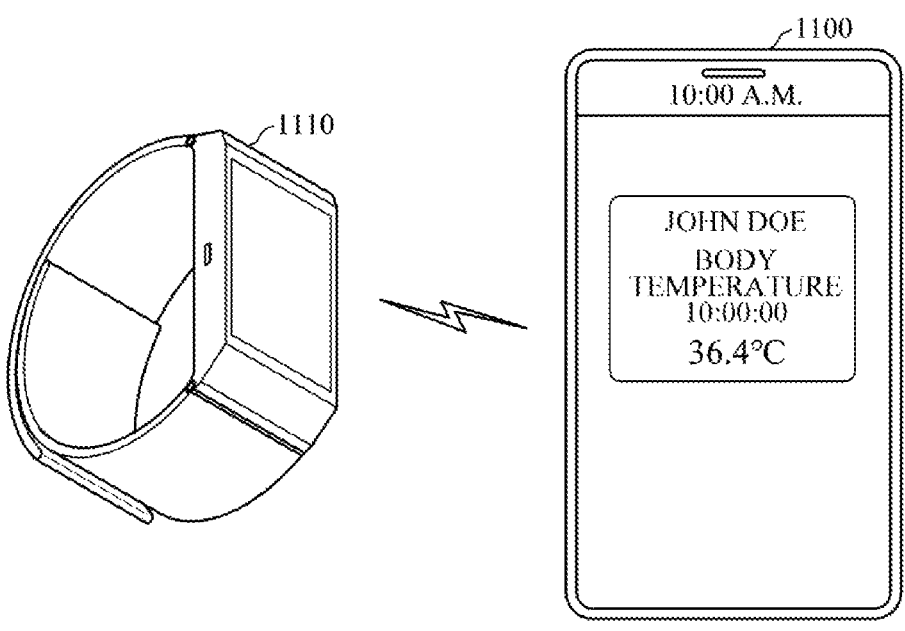

Referring to FIG. 11, the electronic device may be implemented as a combination of a wristwatch-type wearable device and a mobile device such as a smartphone. For example, a memory, a communication interface, and a processor for estimating body temperature may be mounted in a main body of a mobile device 1100. Upon receiving a request for measuring body temperature, the processor of the mobile device 1100 may control the communication interface to communicate with a communication module mounted in a main body of the wearable device 1110, to obtain data through the communication interface. Further, upon receiving data, such as the first temperature, the second temperature, the third temperature, etc., from the wearable device, the processor may estimate body temperature and output an estimation result to the display of the mobile device 1100 through an output interface as illustrated herein.

Figure 12:
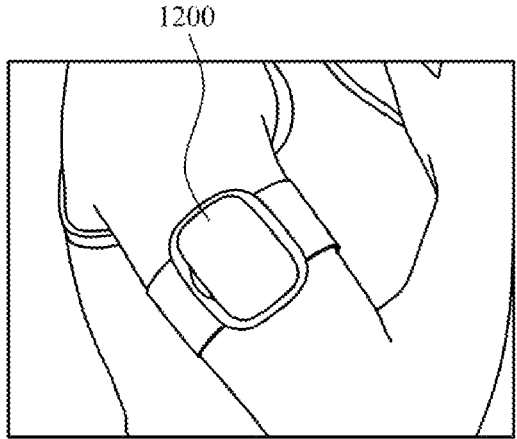

Referring to FIG. 12, an electronic device 1200 may be implemented as a patch-type device.

For example, the electronic device 1200 may be fixed to a body measurement location (e.g., upper arm) by a strap, to measure a user's body temperature. For example, the electronic device 1200 may include a sensor including a flexible sensor board and a contact pad coming into contact with a surface at a body measurement location, a plurality of temperature sensors arranged on the flexible sensor board, thermally conductive materials disposed between the plurality of temperature sensors, and a processor for estimating body temperature based on data obtained by the plurality of temperature sensors. In this case, the flexible sensor board is bent into a predetermined shape so that the plurality of temperature sensors may be arranged gradually away from the surface at the body measurement location.

While not restricted thereto, an example embodiment can be embodied as computer-readable code on a computer-readable recording medium. The computer-readable recording medium is any data storage device that can store data that can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network-coupled computer systems so that the computer-readable code is stored and executed in a distributed fashion. Also, an example embodiment may be written as a computer program transmitted over a computer-readable transmission medium, such as a carrier wave, and received and implemented in general-use or special-purpose digital computers that execute the programs. Moreover, it is understood that in example embodiments, one or more units of the above-described apparatuses and devices can include circuitry, a processor, a microprocessor, etc., and may execute a computer program stored in a computer-readable medium.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An electronic device comprising:
   a sensor comprising:
   a flexible printed circuit board;
   a plurality of temperature sensors arranged on the flexible printed circuit board; and
   a thermally conductive material disposed between the plurality of temperature sensors; and
   at least one processor configured to estimate a body temperature based on data that is obtained by the plurality of temperature sensors when a contact surface of the sensor is contacted with the user,
   wherein the flexible printed circuit board is bent to have the plurality of temperature sensors arranged at at least three different distances from the contact surface of the sensor,
   wherein at least one of the plurality of temperature sensors is positioned on one surface of the flexible printed circuit board, and at least another one of the plurality of temperature sensors is positioned on an opposite surface of the flexible printed circuit board, and
   wherein the flexible printed circuit board is bent into a G-shape.

2. The electronic device of claim 1, wherein the sensor further comprises:
   a first plate and a second plate which are disposed on two opposing sides of the sensor,
   wherein the first plate and the second plate comprise an aluminum material,
   wherein the at least one of the plurality of temperature sensors comprises a first temperature sensor and a second temperature sensor that are in contact with the one surface of the flexible printed circuit board, and the at least another one of the plurality of temperature sensors comprises a third temperature sensor in contact with the opposite surface of the flexible printed circuit board, and
   wherein the third temperature sensor is in contact with the second plate and the opposite surface of the flexible printed circuit board.

3. The electronic device of claim 2, wherein the first temperature sensor, the second temperature sensor, and the third temperature sensor are aligned in a straight vertical direction.

4. The electronic device of claim 1, wherein at least one of the plurality of temperature sensors is a thermistor.

5. The electronic device of claim 1, wherein the plurality of temperature sensors comprise:
   a first temperature sensor configured to measure a first temperature of skin of the user at a body measurement location;
   a second temperature sensor spaced apart from the first temperature sensor in a thickness direction of the electronic device, and configured to measure a second temperature; and
   a third temperature sensor disposed further away from the first temperature sensor than the second temperature sensor in the thickness direction, and configured to measure a third temperature.

6. The electronic device of claim 5, wherein a distance between any two of the first temperature sensor, the second temperature sensor, and the third temperature sensor is in a range from 0.4 mm to 10 mm.

7. The electronic device of claim 6,
   wherein the thermally conductive material is air,
   the distance between any two of the first temperature sensor, the second temperature sensor, and the third temperature sensor is 3 mm or less.

8. The electronic device of claim 5, wherein the at least one processor is further configured to:
   estimate a core temperature of the user and an ambient temperature outside the electronic device based on the first temperature, the second temperature, and the third temperature; and
   estimate the body temperature of the user based on the core temperature at the body measurement location and the ambient temperature outside the electronic device.

9. The electronic device of claim 8, wherein the at least one processor is further configured to:
   estimate a first heat flux based on the first temperature and the second temperature; and
   estimate the core temperature based on the first heat flux and the first temperature.

10. The electronic device of claim 8, wherein the at least one processor is further configured to estimate a second heat flux based on the second temperature and the third temperature, and estimate the ambient temperature outside the electronic device based on the second heat flux and the third temperature.

11. The electronic device of claim 1, further comprising a heat blocker configured to block heat from a side surface of the sensor.

12. The electronic device of claim 1, further comprising a display configured to output at least one of the obtained data, the body temperature, and body temperature guidance information.

* * * * *